United States Patent [19]

Baker et al.

[11] 4,444,994

[45] Apr. 24, 1984

[54] ELECTRICALLY INSULATED QUICK DISCONNECT HEAT SINK

[75] Inventors: James E. Baker, Garland; T. Benjamin Allen, Plano, both of Tex.

[73] Assignee: Varo, Inc., Garland, Tex.

[21] Appl. No.: 343,750

[22] Filed: Jan. 29, 1982

[51] Int. Cl.³ .............................................. H05K 7/20
[52] U.S. Cl. ............................. 174/16 HS; 165/80 B; 165/80 D; 361/386
[58] Field of Search ................. 174/116 HS; 361/386, 361/388, 353, 354; 165/80 B, 80 D

[56] References Cited

U.S. PATENT DOCUMENTS

| | | | |
|---|---|---|---|
| 3,054,025 | 9/1962 | Edmunds | 361/354 |
| 3,163,207 | 12/1964 | Schultz | 174/16 HS |
| 3,202,869 | 8/1965 | Matson et al. | 361/386 |
| 3,209,062 | 9/1965 | Scholz | 165/80 B |
| 3,215,194 | 10/1965 | Sununu et al. | 165/80 B |
| 3,309,581 | 3/1967 | Klein | 361/354 |
| 3,719,860 | 3/1973 | Lawrence | 174/52 FP X |
| 3,904,262 | 9/1975 | Cutchaw | 174/16 HS X |

FOREIGN PATENT DOCUMENTS

| | | | |
|---|---|---|---|
| 2722142 | 11/1978 | Fed. Rep. of Germany | 361/386 |
| 1036355 | 7/1966 | United Kingdom | 174/16 HS |

OTHER PUBLICATIONS

Technical Proposal for Gas Centrifuge Enrichment Plant Prototype Machine Drive Package (MDP); RPA No. BP2-X6083-67; Varo Inc.; Prepared for Union Carbide Corp. Nuclear Division; 12/79.

Primary Examiner—J. V. Trube
Assistant Examiner—Morris H. Nimmo
Attorney, Agent, or Firm—Jerry W. Mills; Gregory M. Howison; Nina Medlock

[57] ABSTRACT

A quick disconnect heat sink includes a first longitudinal bracket having a longitudinal groove along one surface thereof and a second longitudinal bracket having a longitudinal notch along one edge thereof. A heat sink having a first tongue on one end and a second tongue on the other end is disposed between the longitudinal brackets such that the first tongue is inserted in the longitudinal groove and the second tongue rests in the notch. A movable rectangular bracket is attached to the second clamping bracket such that it retains the second tongue between the rectangular clamping bracket and the notch. A first insert is disposed on the first tongue that inserts into a first slot on the first longitudinal bracket and a second insert is disposed on the second tongue that inserts into a second slot on the rectangular bracket, the inserts and slots preventing lateral movement of the heat sink. The rectangular bracket is removable so that the heat sink can be detached.

14 Claims, 6 Drawing Figures

4,444,994

ELECTRICALLY INSULATED QUICK DISCONNECT HEAT SINK

TECHNICAL FIELD

The present invention pertains to removable heat sinks and more particularly to an electrically insulated bracket for a quick disconnect heat sink.

BACKGROUND OF THE INVENTION

In system applications that require a multiplicity of power supplies, such as for a large number of motor drives, a substantial number of units will invariably fail and require repair. Although power supplies utilize solid state components, each having an inherently high mean time before failure (MTBF), the overall system MTBF is substantially lower due to the large number of discrete components utilized. This is especially so in solid state components that are subjected to high operating temperatures, such as the components in a switching regulator.

Statistically, a percentage of devices will fail regardless of how reliable each component is. This failure rate must be accounted for and either an on site repair facility provided or an inventory maintained to replace the failed power supplies. The first alternative is to maintain an inventory of replacement power supplies that are readily available to replace failed units thus reducing system down time. The failed units are then returned to the manufacturer for repair and reconditioning. This step presents substantial delays and requires a large inventory to be maintained to account for units in repair. This alternative is also a very costly one from both the standpoint of the individual cost of the unit and of the storage cost for maintaining an inventory.

The second alternative is to provide an on-site repair facility for reconditioning the failed power supplies. This is a more feasible alternative in that the main requirement is turnaround time to repair a failed unit and return it to inventory. Sometimes the failure to the power supply is nothing more than an inexpensive component that is readily repairable. The primary costs in repairing a power supply on site are first to determine what the failure is and second to effect the required repair. Normally, the trouble shooting step is readily done whereas repair of the unit presents a more formidable problem.

Components that normally fail in a high voltage power supply are usually those that are subjected to high heat dissipation. These components are firmly attached to the heat sinks and securely wired into the circuit. Due to the operating nature of these components, they are not well suited to employing a modular printed circuit card type of replacement due to high resistance in the conductors. The major portion of the labor in repairing a unit is removing the components from the heat sink rather than disconnecting the wiring. For this reason a modular approach requires removal of both the components and the heat sink, which in the past has consisted of tedious disassembly of mounting hardware.

In view of the above problems, there exists a need for a modular type heat sink that is readily replaceable to facilitate repair in a system application requiring a large number of power supplies.

BRIEF DESCRIPTION OF DRAWINGS

For a more complete understanding of the present invention and the advantages thereof, reference is now made to the following description taken in conjunction with the accompanying drawings in which.

SUMMARY OF THE INVENTION

The present invention comprises a quick disconnect heat sink. A first retaining bracket retains one end of the heat sink and allows movement of the heat sink in a first direction only. A second retaining bracket retains the other end of the heat sink allowing movement in both a second direction opposite from the first direction and a third direction orthogonal to both the second and the first direction. A third retaining bracket attaches to the second retaining bracket and in combination prevents movement of the heat sink in the third direction. By removing the third retaining bracket from the second retaining bracket, the heat sink can easily be removed. When the third retaining bracket is in place, the heat sink is firmly disposed between the first and second retaining brackets.

DETAILED DESCRIPTION

Figure 1:
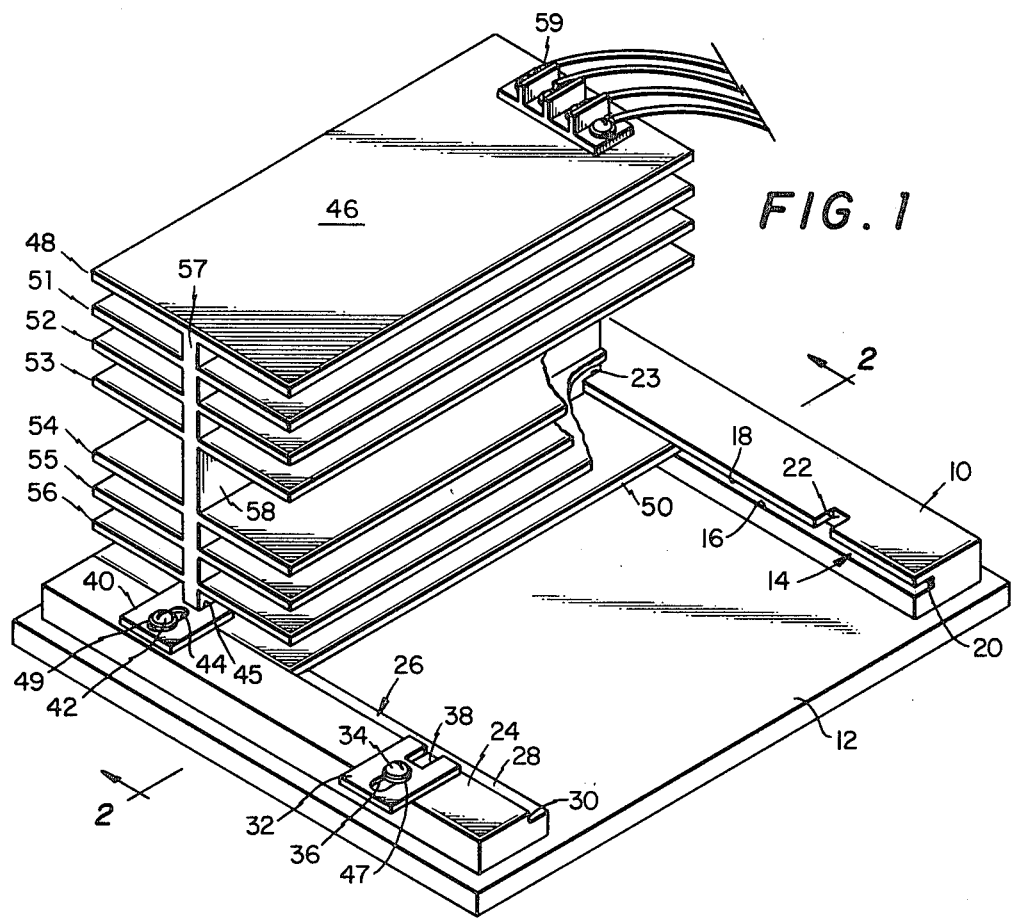
FIG. 1 is a perspective view of a quick disconnect heat sink illustrating one heat sink in place and an empty position for an additional heat sink.

Referring now to FIG. 1, there is shown a perspective view of the present invention. A retaining bracket 10 is firmly mounted on a base 12. The retaining bracket 10 has a longitudinal groove 14 disposed on the lateral surface thereof. The longitudinal groove 14 has a lower surface 16, an upper surface 18 and a rear surface 20. A slot 22 and a slot 23 are disposed on the upper surface of the retaining bracket 10 adjacent to the lateral surface thereof in which the groove 14 is disposed. The slots 22 and 23 extend through the upper surface of the retaining bracket 10 to the upper surface 18 of the groove 14. It should be understood that a plurality of slots can be disposed on the upper surface of the retaining bracket 10.

A retaining bracket 24 is mounted on the base 12 parallel to the retaining bracket 10. A notch 26 is disposed on the upper edge of the retaining bracket 24 directly opposite the longitudinal groove 14. The notch 26 has a lower surface 28 in a plane parallel to the base 12 and a rear surface 30 that is in a plane perpendicular to the base 12 and parallel to the longitudinal groove 14. The retaining brackets 10 and 24 are fabricated out of an electrically insulating material such that the base plate is at a neutral potential. In the present invention, the retaining brackets 10 and 24 are machined out of G-10 material but for high production quantities a moulding process may be more desirable. The type of material used depends upon the type of environment that the brackets are subjected to and the voltage levels. In the present invention, the voltage level is only 250 to 300 volts.

A clamping bracket 32 is mounted on the upper surface of the retaining bracket 24. The clamping bracket 32 is attached to the retaining bracket 24 by a screw 34 inserted through a slot 36 on the upper surface of the clamping bracket 32. A slot 38 is disposed on the lateral surface of the clamping bracket 32 nearestmost the longitudinal groove 14. The slot 38 extends between the upper and lower surfaces of the clamping bracket 32 and is directly opposite the slot 22.

A clamping bracket 40 is disposed on the upper surface of the retaining bracket 24. The clamping bracket 40 is attached to the retaining bracket 24 by a screw 42 inserted through a slot 44 on the upper surface thereof. A slot 45 is disposed on the lateral surface of the clamping bracket 40 nearestmost the longitudinal groove 14. The clamping bracket 40 is identical to the clamping bracket 32.

Each of the clamping brackets 32 and 40 can be positioned such that a portion of the lower surfaces thereof is positioned over the lower surface 28 of the notch 26. The result is that the extended portion of the lower surfaces of each of the clamping brackets 32 and 40, the rear surface 30 of the notch 26 and the lower surface 28 of the notch 26 form a groove. Washers 47 and 49 are disposed between the heads of the screws 34 and 42 and the upper surfaces of the clamping brackets 32 and 40 respectively to facilitate movement.

A heat sink 46 has an upper cooling fin 48, a lower cooling fin 50 and interior cooling fins 51, 52, 53, 54, 55 and 56. A vertical spline 57 is common to the cooling fins 48–56, and is in a plane perpendicular and parallel to the longitudinal axis of each of the cooling fins 48–56.

Components (not shown) that are connected to the heat sink 46 are mounted on a mounting surface 58 that is disposed between the interior cooling fins 53 and 54. A terminal block 59 is mounted on the upper surface of the cooling fin 48 and provides a connection point for both wires from peripheral control circuitry and for wires connected to the components (not shown) on the mounting surface 58. The lower cooling fin 50 is oriented in a plane parallel to the groove 14 and has one end thereof inserted within the groove 14 and the other end thereof resting on the lower surface 28 of the notch 26. The rear surface 20 of the groove 14 and the rear surface 30 of the notch 26 prevent movement of the heat sink 46 along the longitudinal axis thereof.

The clamping bracket 40 is positioned such that the screw 42 is in the rear of the slot 44. The lower surface of the clamping bracket 40 extends over the upper surface of the cooling fin 50 to prevent movement orthogonal to the plane of the base 12. The slot 45 surrounds one end of the vertical spline 57 to prevent lateral movement along the longitudinal axis of the notch 26. The other end of the vertical spline 57 is inserted into the slot 23, thus preventing movement of the heat sink 46 along the longitudinal axis of the retaining bracket 10 and also aiding in alignment of the heat sink 46.

Figure 2:
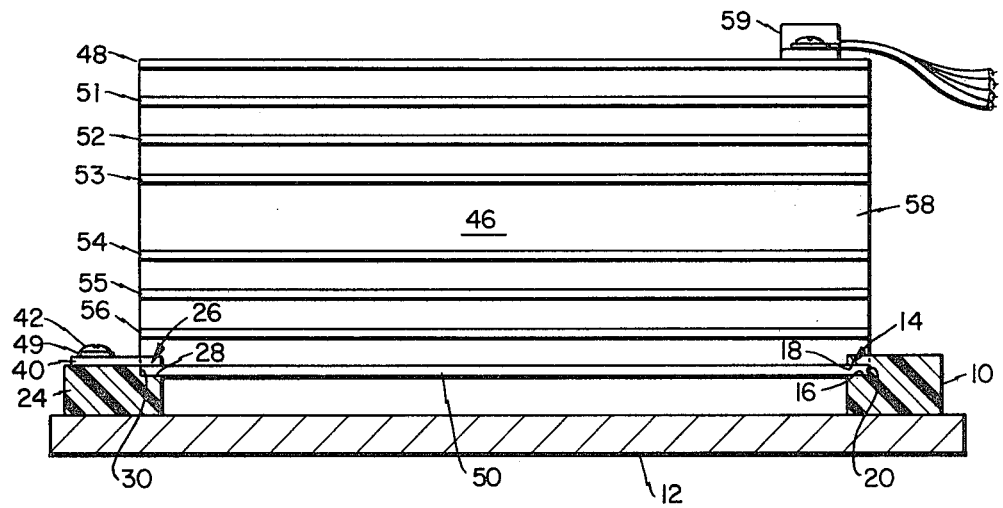
FIG. 2 illustrates a side view of the heat sink and mounting bracket of FIG. 1.

Referring now to FIG. 2, there is shown a side view of a mounted heat sink of FIG. 1. The clamping bracket 40 is shown in the locking position with a portion of the lower surface thereof extending over the notch 26. The lower surface 28 of the notch 26 and the rear surface 30 of the notch 26 combine with the lower surface of the clamping bracket 40 to form a groove, as described above. The lower cooling fin 50 is firmly held in place by this groove. The other end of the lower cooling fin 50 is inserted into the groove 14 and is held firmly in place by the lower surface 16, the rear surface 20 and the upper surface 18. Referring to FIGS. 1 and 2, it can be seen that the groove 14 and the groove formed by the notch 26 and the clamping bracket 40 prevent movement along the longitudinal axis of the heat sink 46. The slot 45 and the slot 23 prevent lateral movement orthogonal to the longitudinal axis of the heat sink 46 and parallel to the plane of the base 12.

To mount the heat sink 46, one end of the lower cooling fin 50 is inserted into the longitudinal groove 14 and the vertical spline 57 is oriented such that it inserts into the slot 23. The other end of the lower cooling fin 50 is positioned onto the lower surface 28 of the notch 26 and the clamping bracket 40 is moved forward such that the slot 45 surrounds the vertical spline 57, thus preventing both lateral movement along the longitudinal axis of the retaining bracket 24 and movement orthogonal to the base 12. By reversing the above steps, the heat sink 46 can be removed from the retaining brackets 10 and 24. The retaining brackets 10 and 24 in combination with the clamping brackets 32 and 40 allow the heat sink and the base 12 to be oriented in any position. The clamping bracket 32 and the slot 22 allow insertion of an additional heat sink similar to the heat sink 46. It should be understood that a plurality of heat sinks can be attached by the above-described method on a common base.

Figure 3:
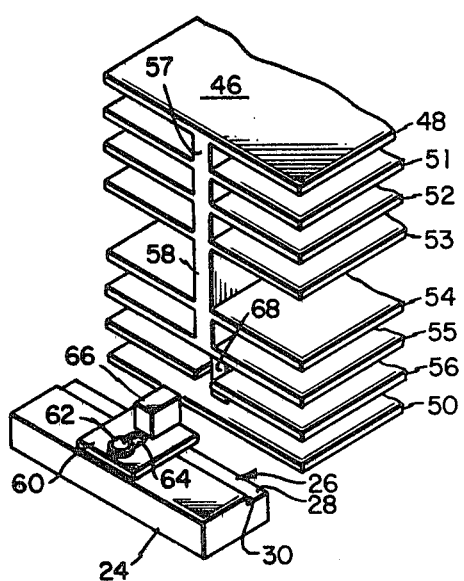
FIG. 3 illustrates an alternate embodiment of the heat sink of FIG. 1.

Referring now to FIG. 3, an exploded view of another embodiment of the present invention is illustrated. Like numerals correspond to like parts in the various figures. A clamping bracket 60 is attached to the retaining bracket 24 with a screw 62 inserted through a slot 64 on the surface of the clamping bracket 60. An insert 66 is mounted on the upper surface of the clamping bracket 60 nearestmost the notch 26. The slot 64 allows the clamping bracket 60 to move in a path perpendicular to the longitudinal axis of the notch 26 such that the end portion of the lower surface of the clamping bracket 60 can be positioned over the lower surface 28 of the notch 26 to form a groove.

A slot 68 is disposed in the vertical spline 57 between the cooling fins 55 and 50 and extending through the edge of the cooling fin 56. The slot 68 is dimensioned such that the insert 66 can be inserted therein with a minimum amount of tolerance.

The lower surface of the lower cooling fin 50 nearestmost the end thereof is positioned over the lower surface 28 of the notch 26. The clamping bracket 60 is positioned such that the end portion of the lower surface thereof is positioned over the lower surface 28 of the notch 26 to form a groove. The insert 66 inserts into the slot 68 to prevent lateral movement of the heat sink 46 along the longitudinal axis of the notch 26. This constitutes the locking position of the clamping bracket 60.

Figure 4:
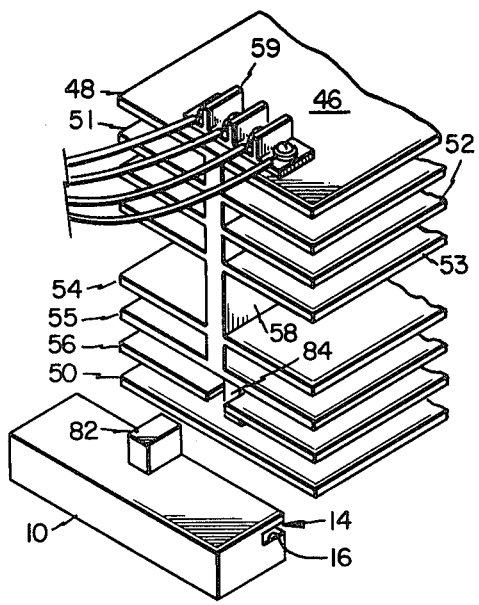
FIG. 4 illustrates another alternate embodiment of the heat sink of FIG. 1.

Now referring to FIG. 4, there is shown an exploded view of an alternate embodiment of the present invention. This view illustrates the other end of the heat sink 46 that is shown in FIG. 3. Like numerals correspond to like parts in the various figures. An insert 82 is disposed on the upper surface of the retaining bracket 10 adjacent to the lateral edge nearestmost the longitudinal groove 14. A slot 84 is disposed in the vertical spline 57 between the cooling fins 55 and 50 and extending through the edge of the cooling fin 56. The slot 84 is dimensioned such that the insert 82 can be inserted therein with a minimum amount of tolerance. The end of the lower cooling fin 50 inserts into the longitudinal groove 14 such that the insert 82 is aligned with the slot 84. The combination of the insert 82 and the slot 84 prevents lateral movement of the heat sink 46 along the longitudinal axis of the groove 14. The combination of the end of the cooling fin 50 and the longitudinal groove 14 comprise a tongue and groove arrangement.

Figure 5:
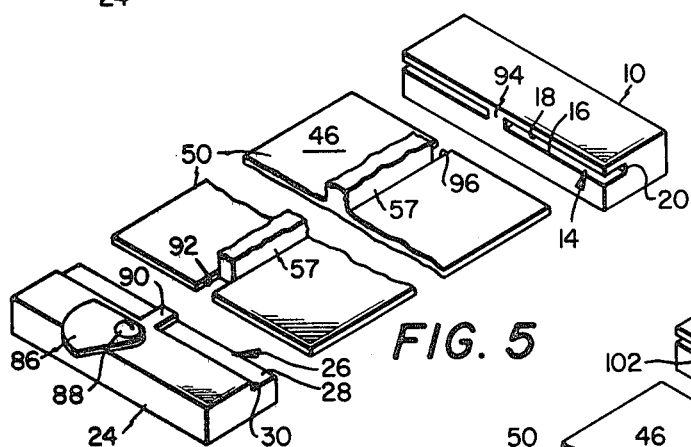
FIG. 5 illustrates another alternate embodiment of the heat sink of FIG. 1.

Now referring to FIG. 5, there is shown an exploded view of an alternate embodiment of the present invention. Like numerals correspond to like parts in the various figures. For the purpose of clarity, only the lower cooling fin 50 is illustrated with a cutaway portion of the vertical spline 57. A rotating clamping bracket 86 is pivotally attached to the retaining bracket 24. The clamping bracket 86 pivots about a retaining screw 88. An insert 90 is mounted on the lower surface 28 of the notch 26. A slot 92 having dimensions equal to those of the insert 90 is disposed on the end of the lower cooling fin 50 in the center thereof. The end portion of the vertical spline 57 adjacent to the retaining bracket 24 is recessed to allow for insertion of the insert 90 into the slot 92.

When the lower surface of the end of the cooling fin 50 is disposed on the lower surface 28 of the notch 26, the heat sink 46 is aligned such that the insert 90 is inserted into the slot 92 to prevent lateral movement along the longitudinal axis of the retaining bracket 24. To lock the heat sink 46, the rotating clamping bracket 86 is rotated in a clockwise direction approximately 90° such that the lower surface of the end portion thereof is adjacent to the upper surface of the end of the cooling fin 50. The rotating clamping bracket 86 prevents movement in a direction orthogonal to the plane of the lower surface 28.

An insert 94 is disposed between the upper surface 18 and the lower surface 16 of the longitudinal groove 14. A slot 96 is disposed on the end of the cooling fin 50 in the center thereof. The dimensions of the slot correspond to the dimensions of the insert 94. In addition, the end portion of the vertical spline 57 adjacent to the retaining bracket 10 is recessed to allow for insertion of the insert 94 into the slot 96. When the end of the lower cooling fin 50 is inserted into the groove 14, the heat sink 46 is aligned such that the insert 94 is inserted into the slot 96. This prevents lateral movement of the heat sink 46 along the longitudinal axis of the groove 14.

Figure 6:
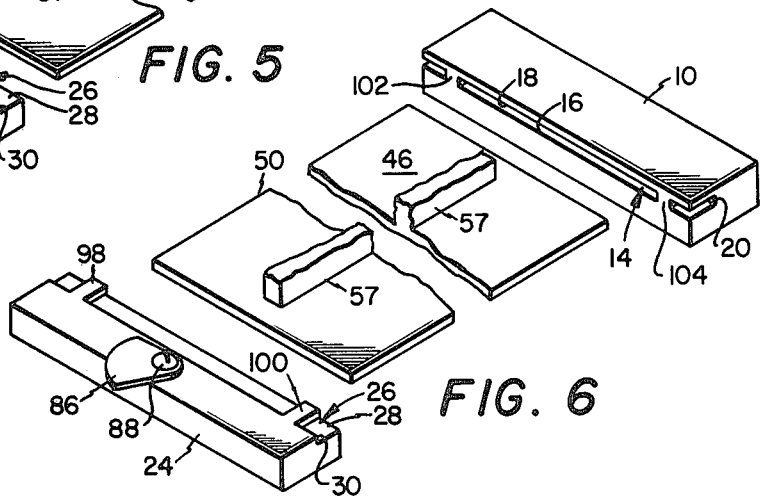
FIG. 6 illustrates yet another alternate embodiment of the heat sink of FIG. 1.

Referring now to FIG. 6, there is shown an exploded view of an alternate embodiment of the present invention. Like numerals correspond to like parts in the various figures. An insert 98 and an insert 100 are disposed on the lower surface 28 of the notch 26. The minimum distance between the inserts 98 and 100 is equal to the end width of the lower cooling fin 50. The end of the vertical spline 57 adjacent to the retaining bracket 24 is recessed to allow for rotation of the rotating clamping bracket 86. When the end of the cooling fin 50 is disposed on the lower surface 28 of the notch 26, the heat sink 46 is aligned between the inserts 98 and 100. To lock the heat sink 46, the rotating clamping bracket 86 is rotated, as described above with reference to FIG. 5.

An insert 102 and an insert 104 are disposed within the longitudinal groove 14. The minimum distance between the inserts 102 and 104 is equal to the end width of the cooling fin 50. The end portion of the vertical spline 57 adjacent to the end of the cooling fin 50 is recessed to allow for insertion of the cooling fin 50 into the groove 14. When the end of the cooling fin 50 is inserted into the groove 14, the heat sink 46 is aligned such that the inserts 102 and 104 are disposed on either side of the cooling fin 50. The heat sink 46 is therefor prevented from moving along a path parallel to the longitudinal axis of the groove 14.

In summary, the present invention provides a quick disconnect heat sink that enhances maintainability without reducing structural compatibility with the remaining system. The heat sinks and their associated components can easily be removed and/or replaced by sliding one of the clamping brackets. This enables a technician to quickly replace one of a plurality of heat sinks with its associated circuitry on an individual power supply. The power supply is then put back into inventory with a minimum of turnaround time. The defective heat sink with its associated circuitry is returned to the manufacturer for repair and reconditioning. Instead of requiring a large inventory of power supplies, only a stock of modularized heat sinks is required.

Although the preferred embodiment of the invention has been described in detail, it should be understood that various changes, substitutions and alterations can be made therein without departing from the spirit and scope of the invention as defined by the appended claims.

I claim:

1. A cooling apparatus, comprising:
    a cooling member having a first tongue at one end thereof and a second tongue at the other end thereof;
    a first stationary bracket having a first longitudinal groove along the edge thereof for receiving said first tongue;
    a second stationary bracket having a notch along the edge thereof;
    a clamping bracket for attachment to said second stationary bracket, said clamping bracket being adjustable such that the end portion of the lower surface thereof overlaps said notch to form a second longitudinal groove for receiving said second tongue;
    first retaining means for preventing movement of said first tongue along the longitudinal axis of said first groove, the combination of said first retaining means and said first stationary bracket allowing movement of said cooling member in a first direction only, said first direction directed outward from said first longitudinal groove; and
    second retaining means for preventing movement of said second tongue along the longitudinal axis of said second groove, the combination of said second retaining means, said second stationary bracket and said clamping bracket only allowing movement of said heat sink in a second direction that is opposite said first direction, said cooling member being retained when said clamping bracket is attached to form said second groove and said cooling member being removable when said clamping bracket is adjusted to allow movement of said second tongue in a direction perpendicular to both said second direction and the notch in said second bracket.

2. The apparatus of claim 1 wherein said first stationary bracket and said second stationary bracket are electrically insulating and thermally conductive.

3. The apparatus of claim 1 wherein said clamping bracket comprises a rectangular bracket having a screw inserted therethrough for attachment to said second stationary bracket.

4. The apparatus of claim 1 wherein said clamping bracket comprises a rectanglar bracket having a slot on the upper surface thereof and extending through to the lower surface thereof and a screw inserted through said slot for attaching said rectangular bracket to said second stationary bracket wherein said screw can be loosened to allow said rectangular bracket to reciprocate in said first and second direction.

5. The apparatus of claim 1 wherein said clamping bracket comprises an elongated member pivotally mounted at one end thereof on said second stationary bracket such that rotation of said elongated member extends the end portion thereof over said notch to form said second groove.

6. The apparatus of claim 1 wherein said first retaining means comprises a first insert and a second insert disposed within said first longitudinal groove, said first and second inserts spaced a distance equal to the width of said first tongue such that said first and second inserts prevent movement of said first tongue along the longitudinal axis of said first groove.

7. The apparatus of claim 1 wherein said second retaining means comprises a first insert and a second insert disposed on the surface of said notch, said first and second inserts spaced a distance equal to the width of said second tongue such that said first and second inserts prevent movement of said second tongue along longitudinal axis of said notch.

8. The apparatus of claim 1 wherein said first retaining means comprises an insert disposed on said one end of said cooling member and a slot disposed on said first stationary bracket for receiving said insert, the insertion of said insert into said slot preventing movement of said cooling member along the longitudinal axis of said first longitudinal groove.

9. The apparatus of claim 1 wherein said second retaining means comprises an insert disposed on said other end of said cooling member and a slot disposed on the upper surface of said clamping bracket, the insertion of said insert into said slot preventing movement along the longitudinal axis of said second longitudinal groove.

10. The apparatus of claim 1 wherein said first retaining means comprises an insert disposed within said first longitudinal groove and a slot disposed on said one end of said heat sink for receiving said insert, the insertion of said insert into said slot preventing movement of said cooling member along the longitudinal axis of said first longitudinal groove.

11. The apparatus of claim 1 wherein said second retaining means comprises an insert disposed within said notch and a slot disposed on said other end of said cooling member for receiving said insert, the insertion of said insert into said slot preventing movement of said cooling member along the longitudinal axis of said notch.

12. The apparatus of claim 1 wherein said first retaining means comprises an insert disposed on the external surface of said first stationary bracket and a slot disposed on said cooling member adjacent to said one end of said cooling member for receiving said insert, the insertion of said insert into said slot preventing movement of said cooling member along the longitudinal axis of said first longitudinal groove.

13. The apparatus of claim 1 wherein said second retaining means comprises an insert disposed on said clamping bracket and a slot disposed on said other end of said cooling member for receiving said insert, the insertion of said insert into said slot preventing movement of said cooling member along the longitudinal axis of said second groove.

14. An apparatus comprising:
a base;
a heat sink a first tongue disposed at one end of the heat sink;
a second tongue disposed at the other end of the heat sink;
said first tongue having a first insert disposed on the surface thereof and said second tongue having a second insert disposed on the surface thereof;
a first longitudinal bracket mounted on said base, said first bracket having a first longitudinal groove disposed on the surface thereof adjacent said base for receiving said first tongue and a first slot disposed adjacent to said first longitudinal groove for receiving said first insert wherein the insertion of said first tongue and said first insert into said first groove and said first slot, respectively, allows movement of the heat sink in a first direction only, said first direction directed outward from said first groove;
a second longitudinal bracket mounted on said base, said second bracket having a longitudinal notch disposed on the edge thereof opposite said base, said first and second bracket fabricated of electrically insulating material; and
a rectangular bracket movably mounted on the surface of said second bracket opposite said base, the end portion of said rectangular bracket covering a portion of said notch to form a second longitudinal groove for receiving said second tongue, said rectangular bracket also having a second slot on the end thereof for receiving said second insert wherein the insertion of said second tongue into said groove and said second insert into said second slot respectively allows movement in a second direction only, said second direction directed outward from said second groove and opposite said first direction, thus retaining the heat sink, said rectangular bracket removable to provide an additional direction of motion orthogonal to said first and second directions such that the heat sink can be removed.

* * * * *

UNITED STATES PATENT AND TRADEMARK OFFICE
CERTIFICATE OF CORRECTION

PATENT NO.  : 4,444,994
DATED       : April 24, 1984
INVENTOR(S) : James E. Baker and Benjamin Allen It is certified that error appears in the above-identified patent and that said Letters Patent is hereby corrected as shown below:

Col. 5, line 38, following "slot" insert --96--.

Col. 8, line 48, following "said" (first occurrence), insert --second--.

Signed and Sealed this

Twenty-sixth Day of February 1985

[SEAL]

Attest:

DONALD J. QUIGG

Attesting Officer

Acting Commissioner of Patents and Trademarks